(12) United States Patent  (10) Patent No.: US 8,247,811 B2
Morosawa et al.  (45) Date of Patent: Aug. 21, 2012

(54) THIN-FILM TRANSISTOR AND DISPLAY DEVICE

(75) Inventors: Narihiro Morosawa, Kanagawa (JP); Takashige Fujimori, Kanagawa (JP)

(73) Assignee: Sony Corporation, Tokyo (JP)

( * ) Notice: Subject to any disclaimer, the term of this patent is extended or adjusted under 35 U.S.C. 154(b) by 276 days.

(21) Appl. No.: 12/694,354

(22) Filed: Jan. 27, 2010

(65) Prior Publication Data

US 2010/0193784 A1  Aug. 5, 2010

(30) Foreign Application Priority Data

Feb. 4, 2009  (JP) ................. 2009-024034

(51) Int. Cl.
*H01L 29/10* (2006.01)

(52) U.S. Cl. ........ 257/43; 257/59; 257/72; 257/E29.296

(58) Field of Classification Search ..................... 257/43, 257/59, 72, E29.296

See application file for complete search history.

(56) References Cited

U.S. PATENT DOCUMENTS 7,385,224 B2 * 6/2008 Ishii et al. ........................ 257/72

2009/0167974 A1 * 7/2009 Choi et al. ....................... 349/43
2011/0095288 A1 * 4/2011 Morosawa et al. ............. 257/43

FOREIGN PATENT DOCUMENTS

| CN | 1405898 | 3/2003 |
| CN | 101090073 | 12/2007 |
| JP | 3913756 | 2/2007 |
| JP | 2007-258223 | 10/2007 |

* cited by examiner

*Primary Examiner* — Minh-Loan T Tran
(74) *Attorney, Agent, or Firm* — SNR Denton US LLP

(57) ABSTRACT

A thin-film transistor includes: a gate electrode formed on a substrate; an oxide semiconductor layer forming a channel region corresponding to the gate electrode; a first gate insulating film formed on the substrate and the gate electrode, and including a silicon nitride film; a second gate insulating film selectively formed to contact with the oxide semiconductor layer in a region, on the first gate insulating film, corresponding to the oxide semiconductor layer, and including one of a silicon oxide film and a silicon oxynitride film; a source/drain electrode; and a protecting film. An upper surface and a side surface of the oxide semiconductor layer and a side surface of the second gate insulating film are covered, on the first gate insulating film, by the source/drain electrode and the protecting film.

9 Claims, 13 Drawing Sheets

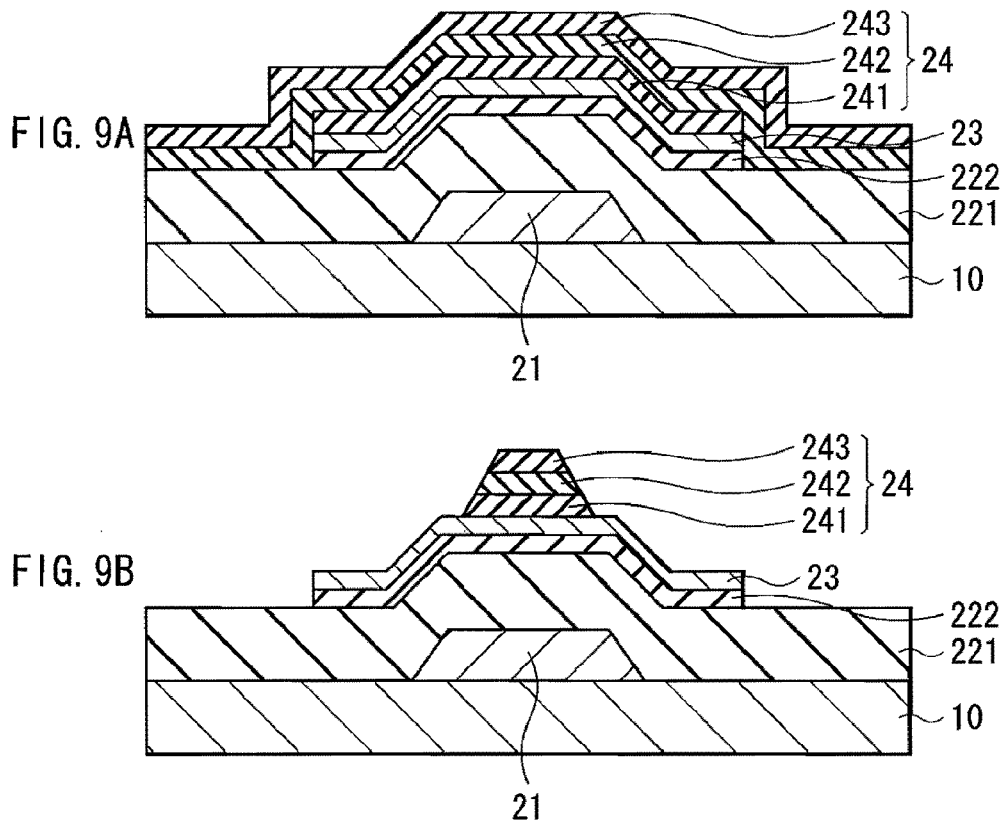
FIG. 9A
FIG. 9B
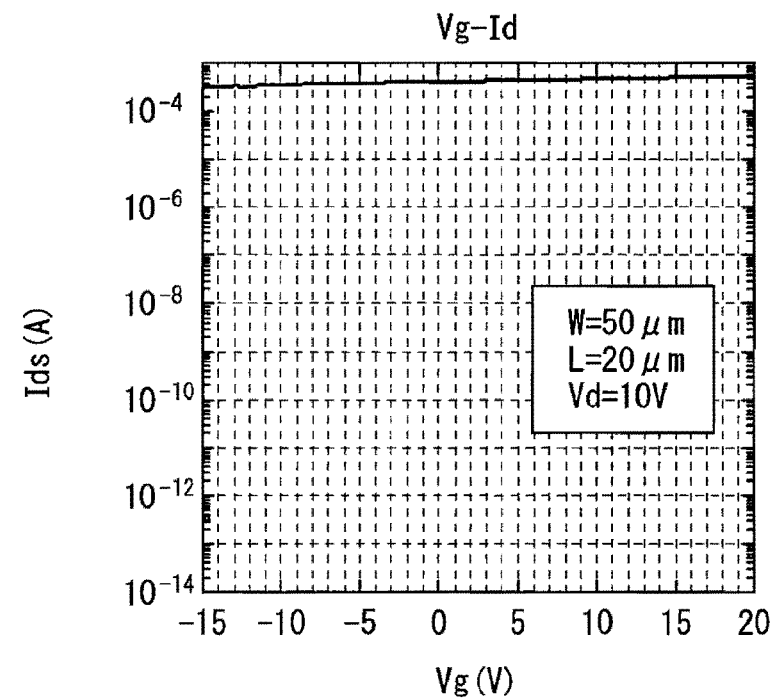
FIG. 10

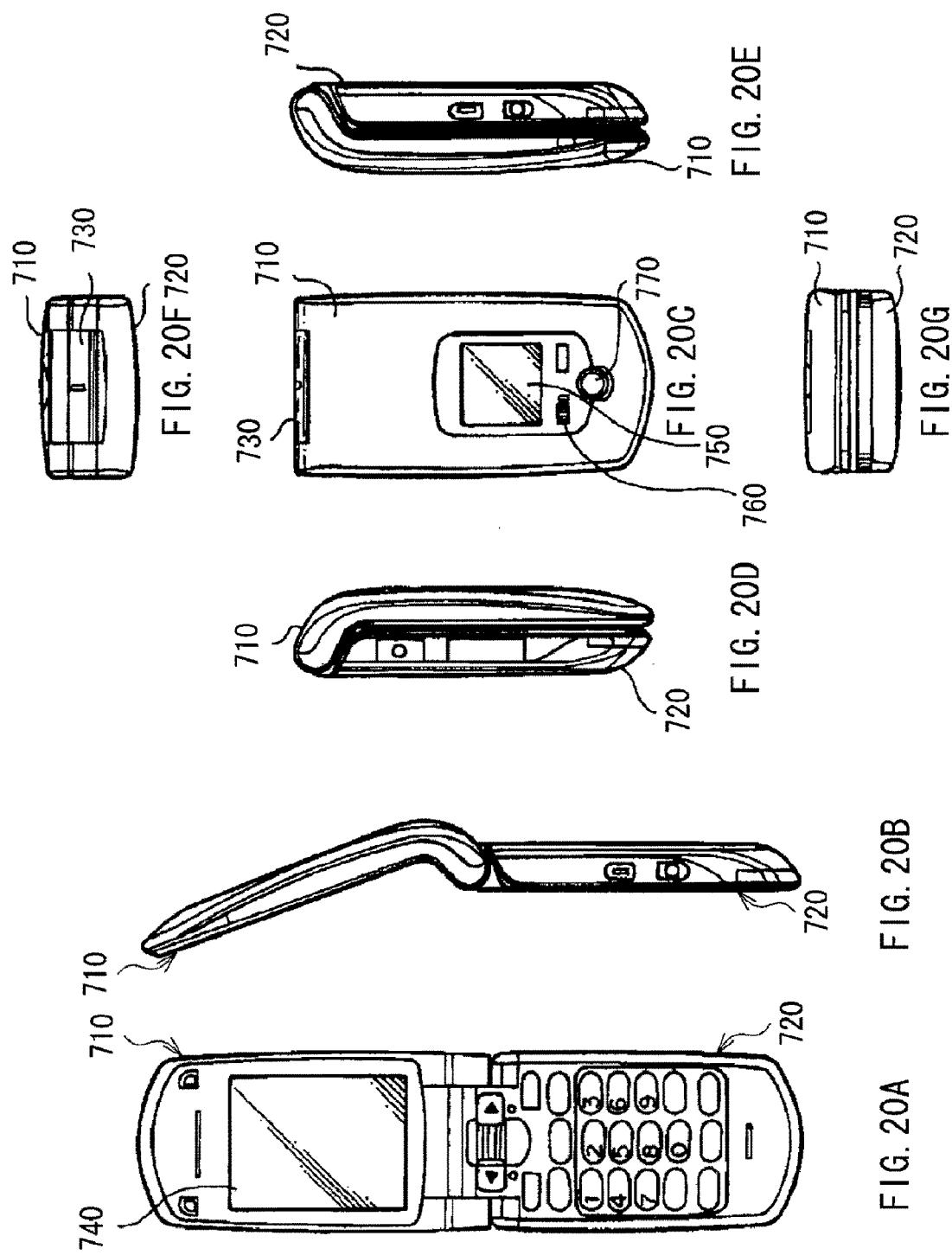

THIN-FILM TRANSISTOR AND DISPLAY DEVICE

BACKGROUND OF THE INVENTION

1. Field of the Invention

The present invention relates to a thin-film transistor in which an oxide semiconductor layer is used, and to a display device provided with the thin-film transistor.

2. Description of the Related Art

An oxide semiconductor such as zinc oxide and Indium Gallium Zinc Oxide (IGZO) exhibits a superior property as an active layer of a semiconductor device. In recent years, development of such an oxide semiconductor is in progress, aiming at an application such as a thin-film transistor (hereinafter may be referred to as "TFT"), a light-emitting device, a transparent conductive film, and so forth.

For example, the TFT utilizing the oxide semiconductor is high in electron mobility and has excellent electrical characteristics as compared with TFT, used in existing liquid crystal display devices, that utilizes amorphous silicon (a-Si:H) for a channel. The TFT utilizing the oxide semiconductor also has an advantage that high electron mobility can be expected even when temperature is low around room temperature.

On the other hand, it is known that the oxide semiconductor is insufficient in heat resistance, and desorption of oxygen, zinc, and the like occurs by a heat treatment during a manufacturing process of TFT to form a lattice defect. The lattice defect forms an electrically shallow impurity level, and causes low resistance in an oxide semiconductor layer. Thereby, the TFT exhibits a normally-on operation or a "depletion operation", in which a drain current flows even when a gate voltage is not applied. When increase in the defect level progresses, a threshold voltage becomes small and thus a leak current increases.

Also, such a lattice defect prevents induction of carriers in zinc oxide serving as an active layer, and reduces carrier concentration. The reduction in the carrier concentration lowers electrical conductivity of the active layer, and thus influences the electron mobility and current transmission characteristics (for example, sub-threshold characteristic, threshold voltage, etc.) of the TFT.

Accordingly, Japanese Patent Registration No. 3913756, for example, proposes to configure a gate insulating layer, which is in contact with a channel layer including an oxide semiconductor, by amorphous aluminum oxide ($Al_2O_3$) to reduce a defect level at an interface.

SUMMARY OF THE INVENTION

A film of an oxide semiconductor further has a characteristic in which carrier concentration in a semiconductor varies significantly by adsorption of water or moisture. Thus, it has been desired to achieve a device structure which suppresses incorporation of the moisture, in order to put a thin-film transistor, which uses the oxide semiconductor film as a channel, to practical use.

As described in the foregoing, it has been difficult for existing technologies to suppress formation of a lattice defect and the adsorption of moisture in the oxide semiconductor layer to improve reliability.

It is desirable to provide a thin-film transistor capable of improving reliability in a thin-film transistor in which an oxide semiconductor layer is included, and a display device provided with the thin-film transistor.

A thin-film transistor according to an embodiment of the invention includes: a gate electrode formed on a substrate; an oxide semiconductor layer forming a channel region corresponding to the gate electrode; a first gate insulating film formed on the substrate and the gate electrode, and including a silicon nitride film; a second gate insulating film selectively formed to contact with the oxide semiconductor layer in a region, on the first gate insulating film, corresponding to the oxide semiconductor layer, and including one of a silicon oxide film and a silicon oxynitride film; a source/drain electrode; and a protecting film. An upper surface and a side surface of the oxide semiconductor layer and a side surface of the second gate insulating film are covered, on the first gate insulating film, by the source/drain electrode and the protecting film.

A display device according to an embodiment of the invention includes: a display element; and a thin-film transistor, according to the embodiment of the invention described above, driving the display element.

In the thin-film transistor and the display device according to the embodiments of the invention, the second gate insulating film including the silicon oxide film or the silicon oxynitride film is selectively formed to contact with the oxide semiconductor layer in the region corresponding to the oxide semiconductor layer. Thus, oxygen in the oxide semiconductor layer is maintained in a stable state, and a favorable device-interface having low interface-state density is formed between the second gate insulating film and the oxide semiconductor layer. Also, the upper surface and the side surface of the oxide semiconductor layer and the side surface of the second gate insulating film are covered, on the first gate insulating film including the silicon nitride film, by the source/drain electrode and the protecting film. Thus, the oxide semiconductor layer has a configuration in which the oxide semiconductor layer is shielded against external air. Hence, entry of moisture or the like into the oxide semiconductor layer is suppressed.

According to the thin-film transistor and the display device of the embodiments of the invention, the second gate insulating film including the silicon oxide film or the silicon oxynitride film is selectively formed to contact with the oxide semiconductor layer in the region corresponding to the oxide semiconductor layer. Thus, the favorable device-interface is formed between the second gate insulating film and the oxide semiconductor layer. Hence, it is possible to suppress formation of a lattice defect in the oxide semiconductor layer. Also, the upper surface and the side surface of the oxide semiconductor layer and the side surface of the second gate insulating film are covered by the source/drain electrode and the protecting film on the first gate insulating film including the silicon nitride film. Thus, the entry of the moisture or the like into the oxide semiconductor layer is suppressed. Hence, it is possible to suppress adsorption of the moisture in the oxide semiconductor layer. Therefore, it is possible to improve the reliability in the thin-film transistor in which the oxide semiconductor layer is included.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the specification, serve to explain the principles of the invention.

FIG. 4A and FIG. 4B are cross-sectional views illustrating the configuration of the TFT illustrated in FIG. 3 respectively, in which FIG. 4A illustrates a cross-sectional configuration taken along line II-II in FIG. 3, and FIG. 4B illustrates a cross-sectional configuration taken along line III-III in FIG. 3.

FIG. 9A and FIG. 9B are cross-sectional views illustrating respectively the processes subsequent to FIG. 8C.

FIG. 10 explains an influence on an operation of the TFT due to desorption of oxygen in the oxide semiconductor.

FIG. 17A and FIG. 17B are perspective views illustrating respectively an outside appearance of Application Example 2 of the display device according to the embodiment of the invention, in which FIG. 17A illustrates the outside appearance seen from a front side, and FIG. 17B illustrates the outside appearance seen from a rear side.

FIG. 20A to FIG. 20G illustrate respectively an outside appearance of Application Example 5 of the display device according to the embodiment of the invention, in which FIG. 20A is a front view in which the Application Example 5 is in an opened state, FIG. 20B is a side view thereof, FIG. 20C is a front view in which the Application Example 5 is in a closed state, FIG. 20D is a left side view thereof, FIG. 20E is a right side view thereof, FIG. 20F is a plan view thereof, and FIG. 20G is a bottom view thereof.

DETAILED DESCRIPTION OF THE PREFERRED EMBODIMENTS

Hereinafter, an embodiment of the present invention will be described in detail with reference to the accompanying drawings. The description will be given in the following order.

1. Embodiment (An example in which first and second insulating films are formed)
2. Modification
2-1. Modification 1 (An example in which a channel protecting film has two-layer structure)
2-2. Modification 2 (An example in which an opening is provided on a channel protecting film only at a part which is in contact with a source/drain electrode)
2-3. Modification 3 (An example in which a protective film or a "passivation film" is provided instead of the channel protecting film)
3. Module and Application Examples

[1. Embodiment]

[Configuration Example of Display Device]

Figure 1:
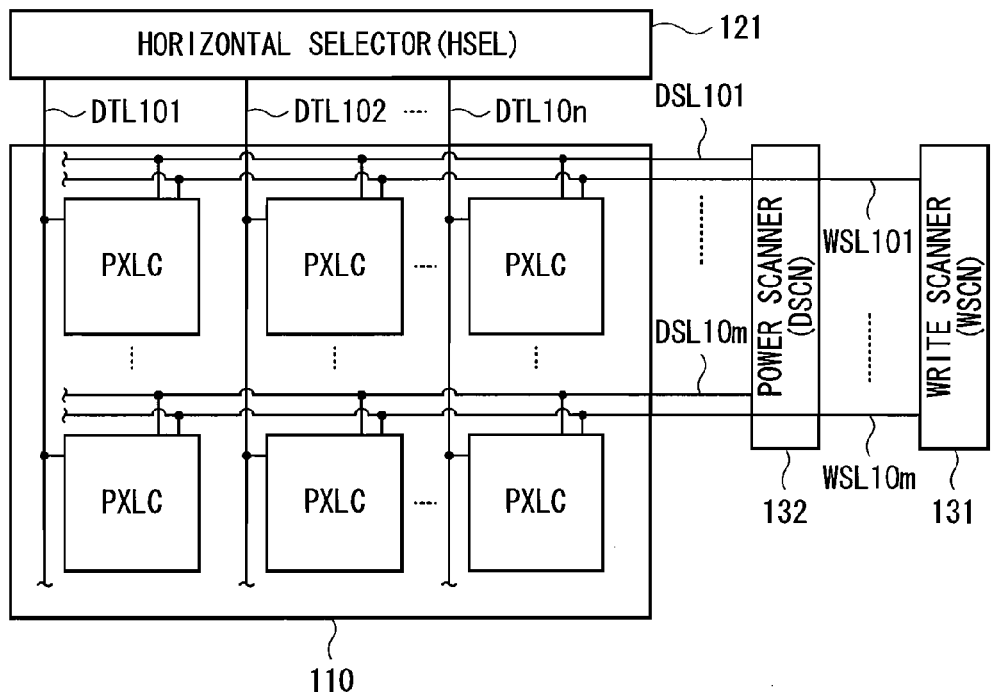
FIG. 1 is a block diagram illustrating a configuration of a display device according to an embodiment of the invention.

FIG. 1 illustrates a configuration of a display device according to an embodiment of the present invention. The display device is used as an organic light-emitting color-display device having an ultrathin profile, for example. The display device is provided with a display region 110 in which pixels PXLC, including a later-described plurality of organic light-emitting elements 10R, 10G, and 10B as display elements, are arranged in a matrix pattern on a TFT substrate 1. Also, a horizontal selector (HSEL) 121 as a signal section, in addition to a write scanner (WSCN) 131 and a power scanner (DSCN) 132 as a scanner section, are provided on the periphery of the display region 110.

Further, signal lines DTL101 to DTL10$n$ are arranged in a column direction, and scanning lines WSL101 to WSL10$m$ as well as power lines DSL101 to DSL10$m$ are arranged in a row direction, in the display region 110. An intersection of each of the signal lines DTL with each of the scanning lines WSL is provided with a pixel circuit 140 including the organic light-emitting element. Each of the signal lines DTL is connected to the horizontal selector 121, and a picture signal is supplied from the horizontal selector 121 to the signal lines DTL. Each of the scanning lines WSL is connected to the write scanner 131, and each of the power lines DSL is connected to the power scanner 132.

Figure 2:
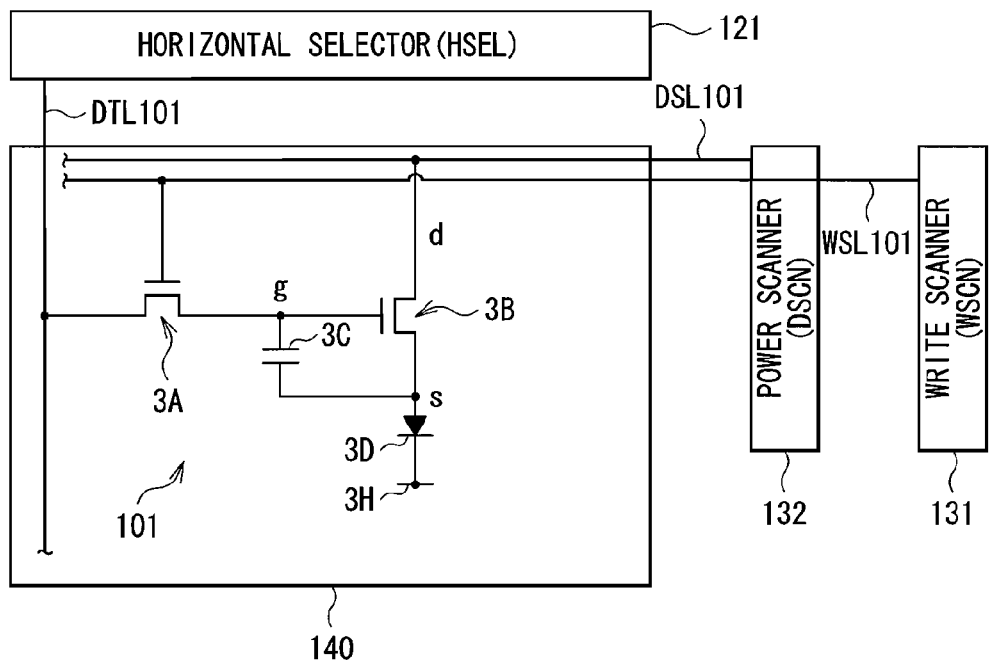
FIG. 2 is an equivalent circuit diagram illustrating an example of a pixel circuit illustrated in FIG. 1.

FIG. 2 illustrates an example of the pixel circuit 140. The pixel circuit 140 is an active drive circuit having a sampling transistor 3A, a driving transistor 3B, a holding capacitor 3C, and a light-emitting element 3D including the organic light-emitting element. The sampling transistor 3A includes a gate connected to the corresponding scanning line WSL101, and a source and a drain, in which one of the source and the drain is connected to the corresponding signal line DTL101 and the other thereof is connected to a gate "g" of the driving transistor 3B. The driving transistor 3B includes the gate g, a drain "d" connected to the corresponding power line DSL101, and a source "s" connected to an anode of the light-emitting element 3D. A cathode of the light-emitting element 3D is connected to a ground line 3H. The ground line 3H is provided or wired in common for all of the pixels PXLC. The holding capacitor 3C is connected between the source s and the gate g of the driving transistor 3B.

The sampling transistor 3A is made conductive in accordance with a control signal supplied from the scanning line WSL101, and samples a signal potential of the picture signal supplied from the signal line DTL101 so as to allow the holding capacitor 3C to hold the same. The driving transistor 3B receives a supply of current from the power line DSL101 which is at a first potential, and supplies a drive current to the light-emitting element 3D in accordance with the signal potential held in the holding capacitor 3C. The light-emitting element 3D emits light with luminance corresponding to the signal potential of the picture signal.

[Configuration Example of TFT]

Figure 3:
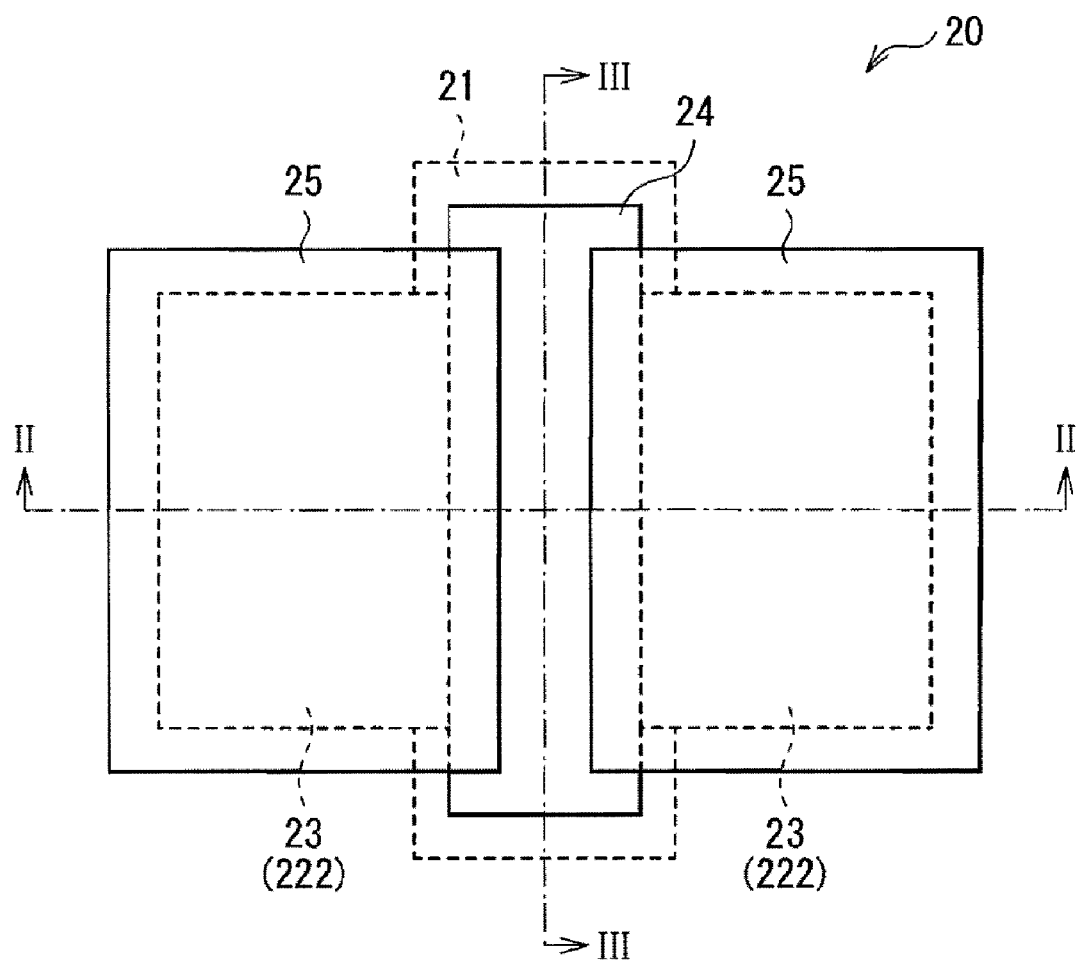
FIG. 3 is a plan view illustrating a configuration of a TFT illustrated in FIG. 2.

FIG. 3 illustrates a plan configuration of a part of the pixel circuit 140 (a part corresponding to the sampling transistor 3A in FIG. 2) of the TFT substrate 1. The TFT substrate 1 includes a TFT 20 structuring the above-described sampling transistor 3A, and so on, which are provided on a substrate such as glass. Note that the driving transistor 3B in FIG. 2 is also structured similarly to the TFT 20, although the drawing thereof is omitted.

Figure 4A:
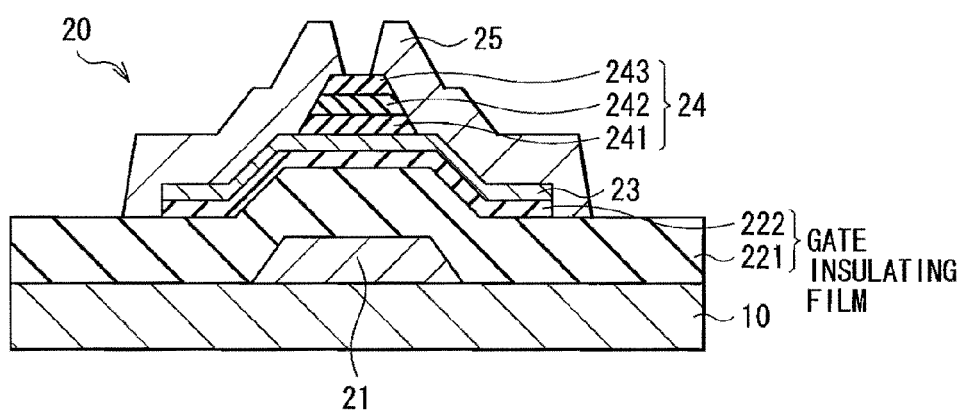
Figure 4B:
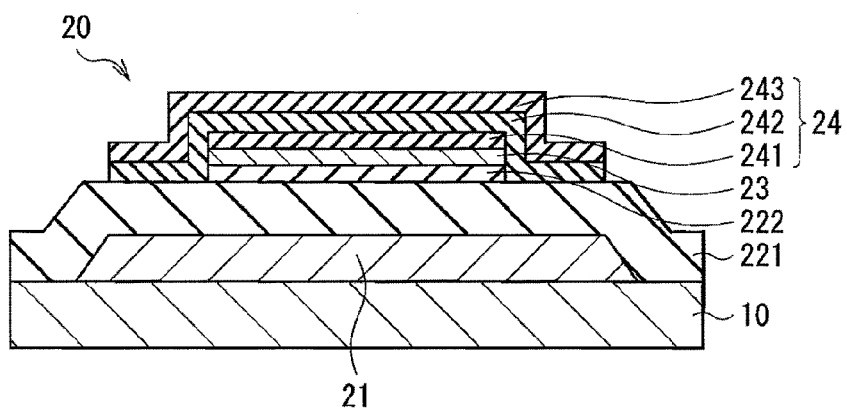

FIG. 4A and FIG. 4B illustrate cross-sectional configurations of the TFT 20 illustrated in FIG. 3 respectively, in which FIG. 4A illustrates the cross-sectional configuration taken along line II-II in FIG. 3, and FIG. 4B illustrates the cross-sectional configuration taken along line III-III in FIG. 3.

The TFT 20 is a bottom-gate oxide semiconductor transistor having a gate electrode 21, gate insulating films 221 and 222, an oxide semiconductor layer 23, a channel protecting film 24, and a source/drain electrode 25 in an order on the substrate 10, for example. As used herein, the "oxide semiconductor" refers to an oxide of zinc, indium, gallium, tin, a mixture thereof, or any other suitable material, which exhibits a superior semiconductor property.

Figure 5:
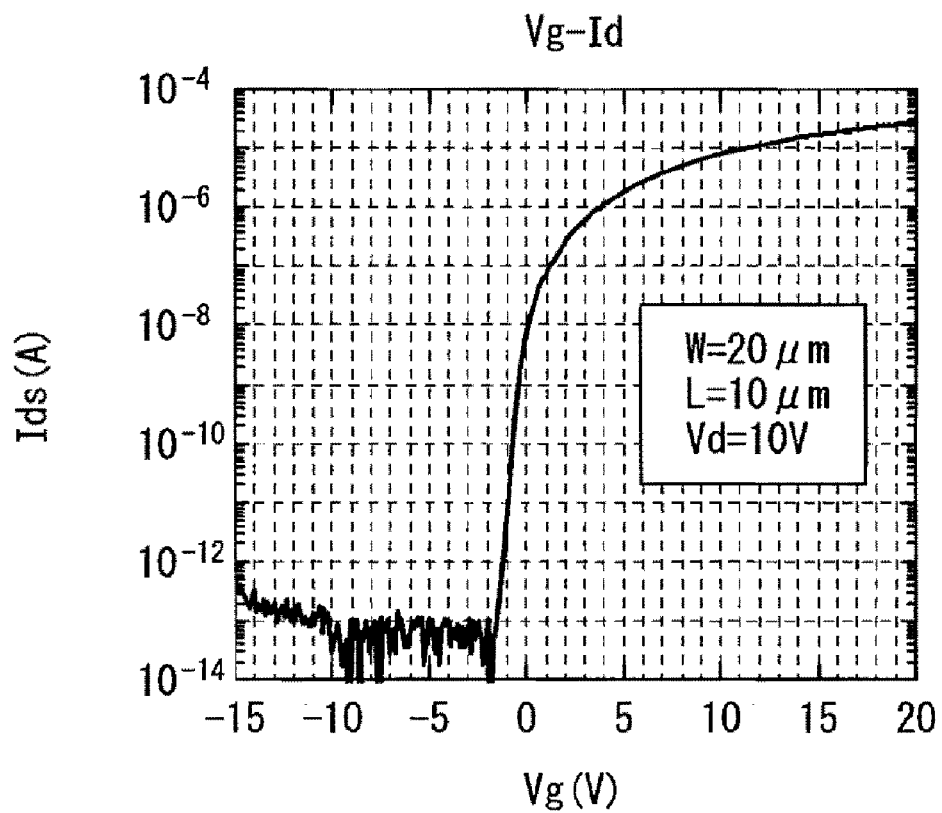
FIG. 5 represents an example of property of the TFT utilizing an oxide semiconductor.

FIG. 5 represents a current-voltage property of the oxide semiconductor TFT based on a mixed oxide of zinc, indium and gallium, or "Indium Gallium Zinc Oxide (IGZO)" for example. The oxide semiconductor exhibits electron mobility which is 10 times to 100 times higher than that of amorphous silicon used in existing semiconductors, and exhibits a favorable OFF characteristic. The oxide semiconductor also has resistivity which is tenth to one hundredth of that of the existing amorphous silicon, and thus a threshold voltage may be set low easily, such as even to 0 (zero) V or less for example.

The gate electrode 21 controls density of electrons in the oxide semiconductor layer 23 by a gate voltage applied to the TFT 20. The gate electrode 21 has a two-layer structure including a molybdenum (Mo) layer and an aluminum (Al) layer or an aluminum alloy layer, for example. A thickness of the molybdenum layer can be about 50 nm, and a thickness of the aluminum layer or the aluminum alloy layer can be about 400 nm.

The gate insulating film has two layers including the gate insulating film 221 and the gate insulating film 222 in an order from the substrate 10 side, for example. A thickness of the gate insulating film 221 can be about 380 nm, and a thickness of the gate insulating film 222 can be about 20 nm. As illustrated in FIGS. 4A and 4B, the gate insulating film has a stacked structure including the gate insulating films 221 and 222 in a lower region of the oxide semiconductor layer 23, and has a single-layer structure including the gate insulating film 221 in a region other than the lower region of the oxide semiconductor layer 23.

The gate insulating film 221 is formed on the substrate 10 and the gate electrode 21, and includes a silicon nitride film. The silicon nitride film has a high relative permittivity as compared with a silicon oxide film and a silicon oxynitride film, and has a characteristic of suppressing diffusion of moisture that varies electrical characteristics of the oxide semiconductor layer 23. In other words, the silicon nitride film is high in barrier property to the moisture, vapor, water or the like, and is thus able to suppress the diffusion of moisture or the like from the substrate 10 side to the oxide semiconductor layer 23.

The gate insulating film 222 is selectively formed to contact with the oxide semiconductor layer 23 in a region on the gate insulating film 221 corresponding to the oxide semiconductor layer 23. The gate insulating film 222 includes a silicon oxide film or a silicon oxynitride film. The silicon oxide film or the silicon oxynitride film has a sufficient amount of oxygen in a film thereof, and is thus able to maintain oxygen in the oxide semiconductor layer 23 in a stable state by contacting with the oxide semiconductor layer 23. This makes it possible to form a favorable device-interface having low interface-state density between the gate insulating film 222 and the oxide semiconductor layer 23.

The oxide semiconductor layer 23 includes Indium Gallium Zinc Oxide (IGZO) for example. A thickness of the oxide semiconductor layer 23 can be about 50 nm. The oxide semiconductor layer 23 is formed with a channel region (not illustrated) corresponding to the gate electrode 21. The oxide semiconductor layer 23 may be patterned to have an unillustrated island-like configuration.

As illustrated in FIGS. 4A and 4B, an upper surface and a side surface of the oxide semiconductor layer 23 and a side surface of the gate insulating film 222 are covered, on the gate insulating film 221, by the source/drain electrode 25 and the channel protecting film 24 which are described hereinafter. This makes it possible for the TFT 20 to operate stably without being influenced by moisture in the atmosphere or the like even when an existing passivation film or a "protective film" is not formed, which will be described later in greater detail.

Figure 6:
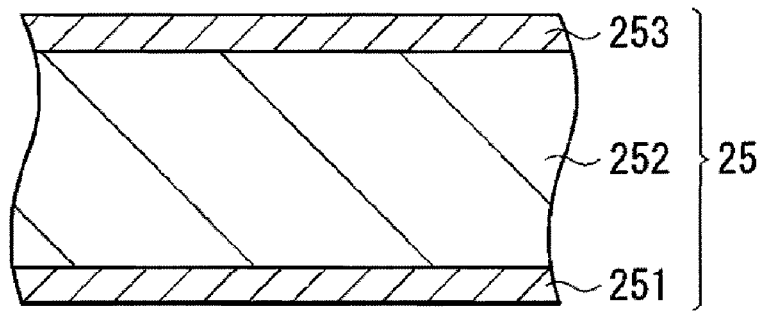
FIG. 6 is a cross-sectional view illustrating a detailed configuration of a source/drain electrode illustrated in FIG. 3, FIG. 4A and FIG. 4B.

The channel protecting film 24 is formed at least in a region corresponding to the channel region in the oxide semiconductor layer 23. The channel protecting film 24 has a three-layer stacked structure including a channel protecting film 241, a channel protecting film 242, and a channel protecting film 243 in an order from the substrate 10 side. Each of the channel protecting films 241 to 243 includes aluminum oxide ($Al_2O_3$) or silicon nitride (SiN, etc.). More specifically, each of the channel protecting films 241 to 243 includes an aluminum oxide film, a silicon nitride film, or a silicon oxynitride film. However, one or both of the channel protecting films 242 and 243 among those films 241 to 243 includes the aluminum oxide film or the silicon nitride film. The channel protecting film 24 having the above-described structure functions to prevent the channel region in the oxide semiconductor layer 23 from damage, and to prevent entry of hydrogen, moisture and so on into the oxide semiconductor layer 23. The channel protecting film 24 also functions to protect the channel region from a resist-removing solution at the time when the source/drain electrode 25 is formed, for example The source/drain electrode 25 includes a multi-layer film in which a plurality of metal layers are stacked, for example. In one embodiment, as illustrated in FIG. 6, the source/drain electrode 25 has a configuration in which three layers including a first metal layer 251, a second metal layer 252, and a third metal layer 253 are stacked, for example. The first metal layer 251 can be about 50 nm, the second metal layer 252 can be about 500 nm, and the third metal layer 253 can be about 50 nm in thickness. Among those metal layers 251 to 253, the first metal layer 251 is formed along an interface with the oxide semiconductor layer 23, and the second metal layer 252 and the third metal layer 253 are formed in this order on the first metal layer 251. Each of the metal layers 251 to 253 includes a metal material, which can be molybdenum (Mo), aluminum (Al), copper (Cu), titanium (Ti), ITO (Indium Tin Oxide), titanium oxide (TiO), or any other suitable material.

However, it is preferable that the first metal layer 251, which is in contact with the oxide semiconductor layer 23, among the metal layers 251 to 253 include molybdenum (Mo) or the metal material which includes oxygen (such as ITO, titanium oxide, and so forth), since this makes it possible to suppress desorption of oxygen in the oxide semiconductor layer 23 and to stabilize electrical characteristics of the TFT 20.

[Example of Cross-Sectional Configuration of Display Region]

Figure 7:
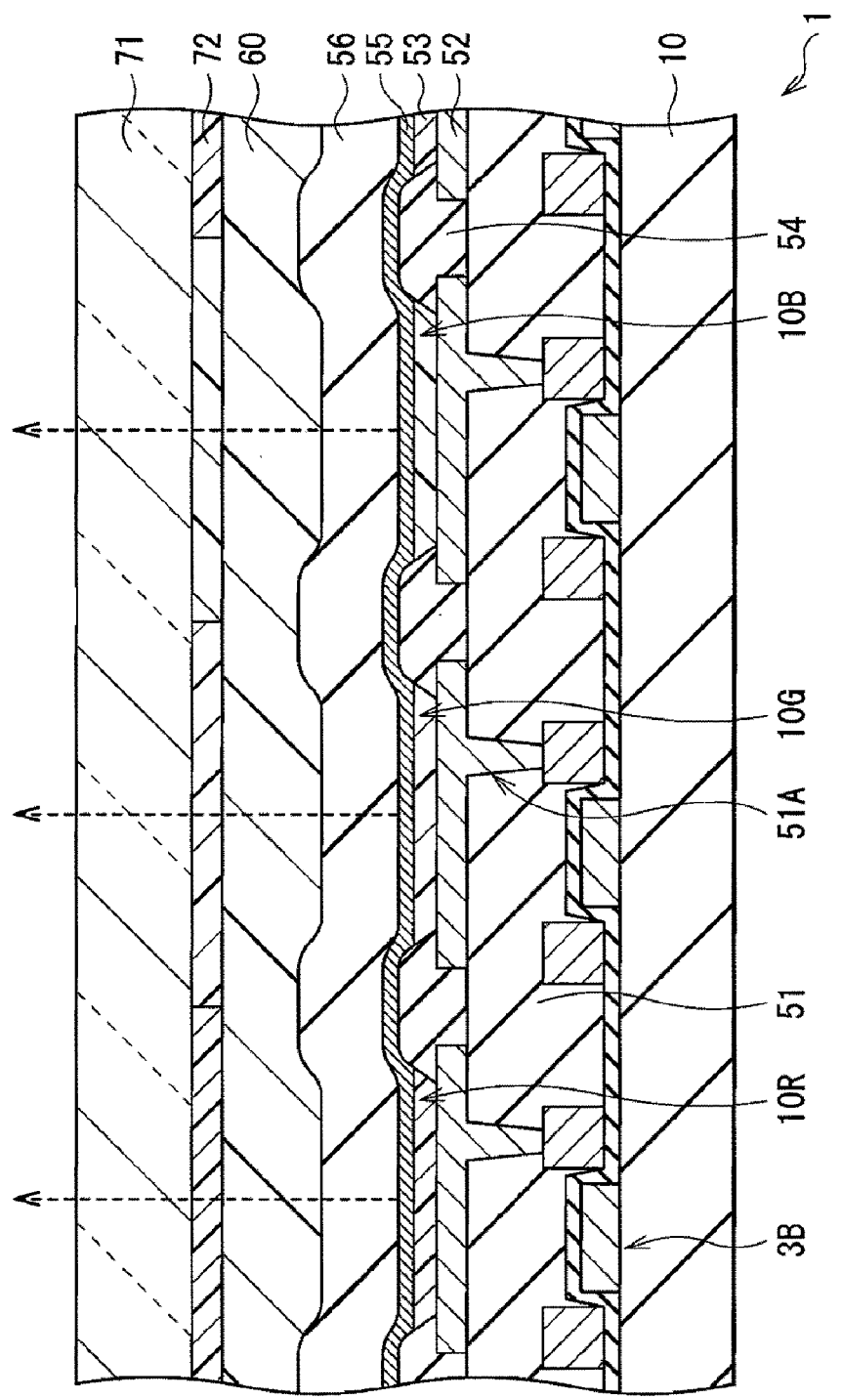
FIG. 7 is a cross-sectional view illustrating an example of configuration of a display region illustrated in FIG. 1.

FIG. 7 illustrates a cross-sectional configuration of the display region 110 illustrated in FIG. 1. The display region 110 is provided with the organic light-emitting element 10R for generating red light, the organic light-emitting element 10G for generating green light, and the organic light-emitting element 10B for generating blue light, which are formed in sequence to have a matrix pattern as a whole. Each of the organic light-emitting elements 10R, 10G, and 10B can have a rectangular shape or a "reed-shape" in planar configuration, and a combination of the adjacent organic light-emitting elements 10R, 10G, and 10B structure one pixel.

Each of the organic light-emitting elements 10R, 10G, and 10B has a configuration in which an anode (positive electrode) 52, an inter-electrode insulating film 54, an organic layer 53 including a light-emitting layer which will be described later, and a cathode (negative electrode) 55 are stacked in this order on the TFT substrate 1 with a flattening insulating film 51 in between.

The organic light-emitting elements 10R, 10G, and 10B may be covered by a protecting film 56 if needed. The protecting film 56 can be silicon nitride (SiN), silicon oxide (SiO), or any other suitable material. Also, a sealing substrate 71 is attached entirely on the protecting film 56 with an adhesion layer 60 in between, in order to provide sealing thereof. The sealing substrate 71 can be a glass, and the adhesion layer 60 can be a thermosetting resin, an ultraviolet curable resin, or any other suitable material. The sealing substrate 71 may be provided with a color filter 72, and a light-shading film (not illustrated) as a black matrix if needed.

The flattening insulating film 51 is for flattening a surface of the TFT substrate 1 on which the pixel circuit 140 is formed. It is preferable that the flattening insulating film 51 be structured with a material having favorable pattern precision, since a fine connecting hole 51A is formed. The material structuring the flattening insulating film 51 can be an organic material such as polyimide, an inorganic material such as silicon dioxide ($SiO_2$), or any other suitable material. The driving transistor 3B illustrated in FIG. 2 is electrically connected to the anode 52 through the connecting hole 51A provided on the flattening insulating film 51. Also, although not illustrated in FIG. 7, a lower layer electrode 31 of a capacitor 30 structuring the holding capacitor 3C is also electrically connected to the anode 52 through the connecting hole (not illustrated) provided on the flattening insulating film 51 (see FIG. 2).

The anode 52 is formed correspondingly for each of the organic light-emitting elements 10R, 10G, and 10B. The anode 52 functions also as a reflecting electrode for reflecting light generated by the light-emitting layer, and thus, it is desirable that the anode 52 have reflectivity as high as possible in order to increase luminous efficiency. A thickness of the anode 52 can be between about 100 nm and 1000 nm both inclusive. The anode 52 includes a single metal element or an alloy of the metal elements, which can be silver (Ag), aluminum (Al), chromium (Cr), titanium (Ti), iron (Fe), cobalt (Co), nickel (Ni), molybdenum (Mo), copper (Cu), tantalum (Ta), tungsten (W), platinum (Pt), gold (Au), or any other suitable material.

The inter-electrode insulating film 54 is for ensuring insulation between the anode 52 and the cathode 55, and for allowing a light-emitting region to be formed accurately into a desired shape. A material structuring the inter-electrode insulating film 54 can be an organic insulating material such as polyimide, an inorganic insulating material such as silicon dioxide ($SiO_2$), or any other suitable material. The inter-electrode insulating film 54 has an opening corresponding to the light-emitting region of the anode 52. The organic layer 53 and the cathode 55 may be provided not only on the light-emitting region but also on the inter-electrode insulating film 54 continuously, although emission of light in this case is generated only in the opening of the inter-electrode insulating film 54.

The organic layer 53 can have a configuration in which a hole injection layer, a hole transporting layer, the light-emitting layer, and an electron transporting layer (which are not illustrated) are stacked in an order from the anode 52 side. The layers other than the light-emitting layer among the hole injection layer, the hole transporting layer, the light-emitting layer, and the electron transporting layer may be provided as needed basis. Also, the organic layer 53 may have a different configuration depending upon the colors of light emission of the organic light-emitting elements 10R, 10G, and 10B. The hole injection layer is for increasing efficiency of hole injection, and is also a buffer layer for preventing leakage. The hole transporting layer increases efficiency in transporting a hole to the light-emitting layer. The light-emitting layer generates light by causing an electron and the hole to be recombined with application of an electrical field. The electron transporting layer increases efficiency in transporting the electron to the light-emitting layer. A material structuring the organic layer 53 can be any low-molecular organic material or any high-molecular organic material known to a person skilled in the art, and is not limited in particular.

The cathode 55 can be between about 5 nm and 50 nm both inclusive in thickness. The cathode 55 includes a single metal element or an alloy of the metal elements, which can be aluminum (Al), magnesium (Mg), calcium (Ca), sodium (Na), or any other suitable material. In particular, an alloy of magnesium (Mg) and silver (Ag) (MgAg alloy), or an alloy of aluminum (Al) and lithium (Li) (AlLi alloy) is preferable. The cathode 55 may include ITO (Indium Tin Oxide), IZO (Indium Zinc Oxide), or the like.

[Example of Method of Manufacturing Display Device]

The display device according to the present embodiment is manufactured, for example, as follows.

[Process of Forming TFT 20]

FIGS. 8A to 9B are cross-sectional views illustrating one example of processing for forming the TFT substrate 1 having the TFT 20.

Figure 8A:
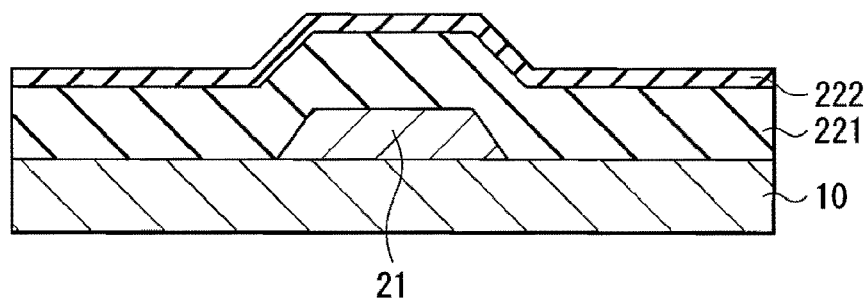
FIG. 8A to FIG. 8C are cross-sectional views illustrating respectively an example of a method of forming a TFT substrate (or TFT) illustrated in FIG. 3, FIG. 4A and FIG. 4B in a process order.

As illustrated in FIG. 8A, the two-layer structure including the molybdenum (Mo) layer having the thickness of about 50 nm and the aluminum (Al) layer or the aluminum alloy layer having the thickness of about 400 nm is first formed on the substrate 10 made of the glass, with a sputtering method, for example. Then, lithography and etching processes are performed on the two-layer structure to form the gate electrode 21, for example.

Then, a two-layer structure including the silicon nitride film serving as the gate insulating film 221 and the silicon oxide film or the silicon oxynitride film, serving as the gate insulating film 222, is formed on an entire surface of the substrate 10 by a sputtering method, a plasma CVD (Chemical Vapor Deposition) method, or the like, for example. It is desirable that the silicon oxide film or the silicon oxynitride film formed at this time on the silicon nitride film be formed at a thickness of between about 5 nm and 50 nm both inclusive, since the silicon oxide film or the silicon oxynitride film as the gate insulating film 222 is removed by an etching process after the oxide semiconductor layer 23 is processed to have the island-like configuration.

Figure 8B:
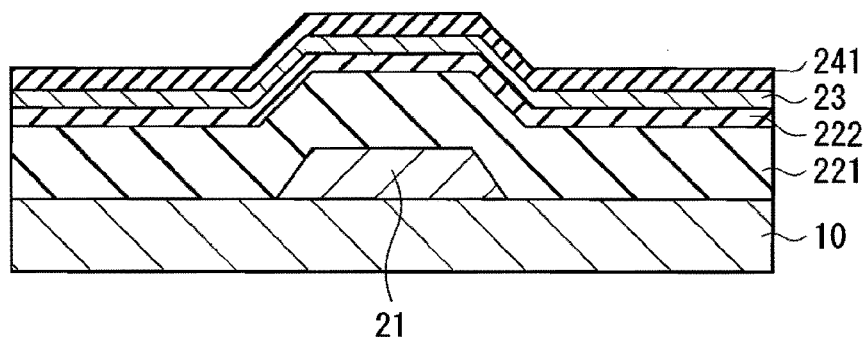

Thereafter, as illustrated in FIG. 8B, an Indium Gallium Zinc Oxide (IGZO) film serving as the oxide semiconductor layer 23 is formed at a thickness of between about 5 nm and 100 nm both inclusive by a sputtering method, for example. In one embodiment where the IGZO is used to structure the oxide semiconductor layer 23, a DC sputtering method utilizing a ceramic target of IGZO and plasma discharge with a mixed gas of argon (Ar) and oxygen ($O_2$) may be used to form the oxide semiconductor layer 23 on the substrate 10 for example. The mixed gas of argon and oxygen may be introduced into a vacuum vessel after the inside of the vacuum vessel is evacuated to have a vacuum of $1 \times 10^{-4}$ Pa or less before the plasma discharge is carried out. In other embodiment where zinc oxide is used to structure the oxide semiconductor layer 23, an RF sputtering method utilizing a ceramic target of zinc oxide, or a DC sputtering method utilizing a metal target of zinc under the gas atmosphere including argon and oxygen, may be used to form the oxide semiconductor layer 23 on the substrate 10 for example.

After forming the oxide semiconductor layer 23, the aluminum oxide film, the silicon nitride film, or the silicon oxynitride film serving as the channel protecting film 241 is formed at a thickness of between about 10 nm and 50 nm both inclusive by a sputtering method, a CVD method, or the like, for example. In one embodiment where the sputtering method is used to form the aluminum oxide film, the silicon nitride film, or the like as the channel protecting film 241, it is preferable that the oxide semiconductor layer 23 and the aluminum oxide film, the silicon nitride film, or the like be formed continuously in a sputtering system, since this makes it possible to uniformize a property of the TFT 20. It is to be noted that the process may proceed to a subsequent process without forming such a channel protecting film 241 when priority is placed on productivity.

Figure 8C:
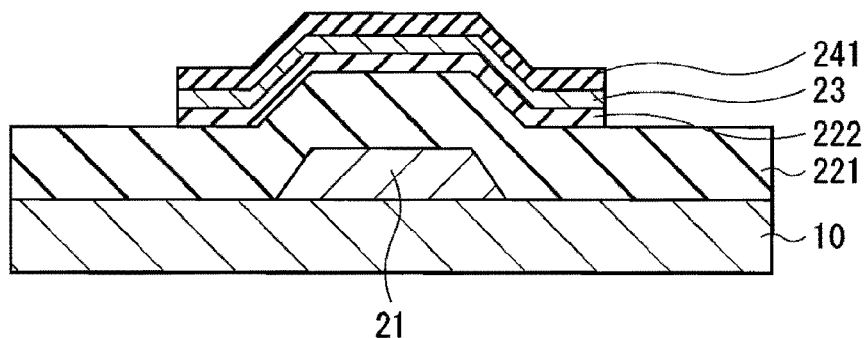

Then, as illustrated in FIG. 8C, the oxide semiconductor layer 23 serving as the channel region of the TFT 20 and the channel protecting film 241 are patterned into the island-like configuration. At this time, the gate insulating film 222 is also etched subsequently after etching the oxide semiconductor layer 23. Thereby, the gate insulating film 222 is only provided in the lower region of the oxide semiconductor layer 23 processed into the island-like configuration, and the gate insulating film 221 is only provided in the region other than the lower region of the oxide semiconductor layer 23.

Then, as illustrated in FIG. 9A, the aluminum oxide film, the silicon nitride film, or the silicon oxynitride film serving as the channel protecting film 242 or 243 is formed sequentially by a CVD method or the like to have the channel protecting films 242 and 243 at a thickness of about 100 nm in total, for example. In one embodiment, the channel protecting film 242 includes the aluminum oxide film, and the channel protecting film 243 includes the silicon nitride film or the silicon oxynitride film. In other embodiment, the channel protecting film 242 includes the silicon nitride film or the silicon oxynitride film, and the channel protecting film 243 includes the aluminum oxide film. It is to be noted that, when a plasma CVD method or the like is used to form the silicon nitride film or the silicon oxynitride film, the plasma CVD method or the like makes it possible for the channel protecting film 24 as a whole to have a thick-film of about 200 nm easily, which is desirable for an etching process in formation of the source/drain electrode 25.

Then, as illustrated in FIG. 9B, photolithography and etching processes are performed on the aluminum oxide film, the silicon nitride film, or the silicon oxynitride film to form the aluminum oxide film, the silicon nitride film, or the silicon oxynitride film into a predetermined configuration. Thereby, the channel protecting film 24 including the channel protecting films 241 to 243 and having the configuration illustrated in FIGS. 4A and 4B is formed.

It is to be noted that in the oxide semiconductor layer 23, an electrical characteristic of a semiconductor may vary due to adsorption of moisture or the like. Accordingly, the aluminum oxide film is used for the channel protecting film such that the electrical characteristics of the TFT 20 are stabilized by an excellent gas-barrier property of the aluminum oxide film, and that the channel protecting film is formed without deteriorating the characteristics of the TFT 20. Also, when an ALD (Atomic Layer Deposition) method is used to form such an aluminum oxide film, a dense insulating film is formable while suppressing generation of hydrogen that deteriorates the electrical characteristics of the oxide semiconductor layer 23. In one embodiment where the ALD method is used, a triethylaluminum gas as a raw-material gas is introduced into a vacuum chamber to form an aluminum film as an atomic layer on a surface of the substrate 10. Then, an ozone gas or an oxygen radical in which an oxygen gas is excited by plasma is introduced and applied to the surface of the substrate 10 to oxidize the aluminum film. Since the initially-formed aluminum film has a thickness of the atomic layer, the aluminum film is easily oxidized by the ozone gas or the oxygen radical, and thus an aluminum oxide film is formed uniformly on an entire surface of the substrate 10. Thereafter, the formation of the aluminum film and the oxidization process are repeated to form the channel protecting film including the aluminum oxide films of a predetermined thickness. This embodiment makes it possible to have a stoichiometric composition without decreasing oxygen concentration in the aluminum oxide film deficiently. Thus, it is possible to have a composition ratio between aluminum and oxygen at an ideal ratio of 2:3, and to form the channel protecting film having the excellent electric characteristics and gas-barrier property.

Then, the source/drain electrode 25 is formed on the gate insulating film 221, the oxide semiconductor layer 23, and the channel protecting film 24 by a sputtering method or the like, for example. In one embodiment, a molybdenum layer having a thickness of about 50 nm (i.e., the first metal layer 251), an aluminum layer having a thickness of about 500 nm (i.e., the second metal layer 252), and a molybdenum layer having a thickness of about 50 nm (i.e., the third metal layer 253) are formed in this order thereon, for example. Then, each of the first metal layer 251, the second metal layer 252, and the third metal layer 253 is formed into a predetermined configuration by photolithography and etching processes. A wet-etching method utilizing a mixture of phosphoric acid, nitric acid, and acetic acid for example can be used for the photolithography and etching processes, although it is not limited thereto. Thereby, the source/drain electrode 25 is formed. Accordingly, the TFT substrate 1 having the TFT 20 illustrated in FIGS. 3, 4A and 4B is formed.

[Process of Forming Organic Light-Emitting Elements 10R, 10G, and 10B]

First, a photo-sensitive resin is applied entirely on a surface of the TFT substrate 1, which is then exposed and developed to form the flattening insulating film 51 and the connecting hole 51A, and firing is then performed thereto. Then, the anode 52 having the material described above is deposited by using a DC sputtering method or the like, which is then selectively etched with a lithography technique or the like to pattern the same into a predetermined configuration, for example. Then, the inter-electrode insulating film 54 having the thickness and the material described above is formed by a CVD method or the like, and the opening is formed with a lithography technique, for example. Thereafter, the organic layer 53 and the cathode 55 having the materials described above are sequentially deposited by a vapor deposition method or the like to form the organic light-emitting elements 10R, 10G, and 10B. Then, the organic light-emitting elements 10R, 10G, and 10B are covered by the protecting film 56 having the material described above.

Thereafter, the adhesion layer 60 is formed on the protecting film 56. The color filter 72 may then be provided. Then, the sealing substrate 71 including the material described above is prepared to attach the TFT substrate 1 to the sealing substrate 71 with the adhesion layer 60 in between. Accordingly, the display device illustrated in FIG. 7 completes.

[Operation and Effect of Display Device]

Now, an operation and an effect of the display device according to the present embodiment will be described, in comparison to a Comparative Example.

In the display device according to the present embodiment, the sampling transistor 3A is made conductive in accordance with the control signal supplied from the scanning line WSL, and the signal potential of the picture signal supplied from the signal line DTL is sampled to be held by the holding capacitor 3C. Further, the current is supplied from the power line DSL, which is at the first potential, to the driving transistor 3B, and the drive current is supplied to the light-emitting element 3D (i.e., the organic light-emitting elements 10R, 10G, or 10B) in accordance with the signal potential held in the holding capacitor 3C. The light-emitting element 3D (the organic light-emitting elements 10R, 10G, or 10B) emits the light with luminance corresponding to the signal potential of the picture signal. The light emitted from the light-emitting element 3D transmits through the cathode 55 (and the color filter 72 where appropriate) and the sealing substrate 71 to be extracted.

Note that an oxide semiconductor is insufficient in heat resistance, and desorption of oxygen and so on may occur due to a heat treatment, a plasma treatment, or the like during a TFT manufacturing process, which may form a lattice defect. The lattice defect may form an electrically shallow impurity level, and may cause low resistance in the oxide semiconductor. Thereby, when the oxide semiconductor is used for an active layer of the TFT, a threshold voltage may become small in accordance with increase in the defect level, and a leak current may increase. Thus, the TFT may exhibit a normally-on operation or a "depletion operation", in which a drain current flows even when a gate voltage is not applied. Also, the TFT may not exhibit a transistor operation and the operation of the TFT may further shift from the transistor operation to a conductor operation when the defect level is increased sufficiently as illustrated in FIG. 10 for example.

Comparative Example

Figure 11:
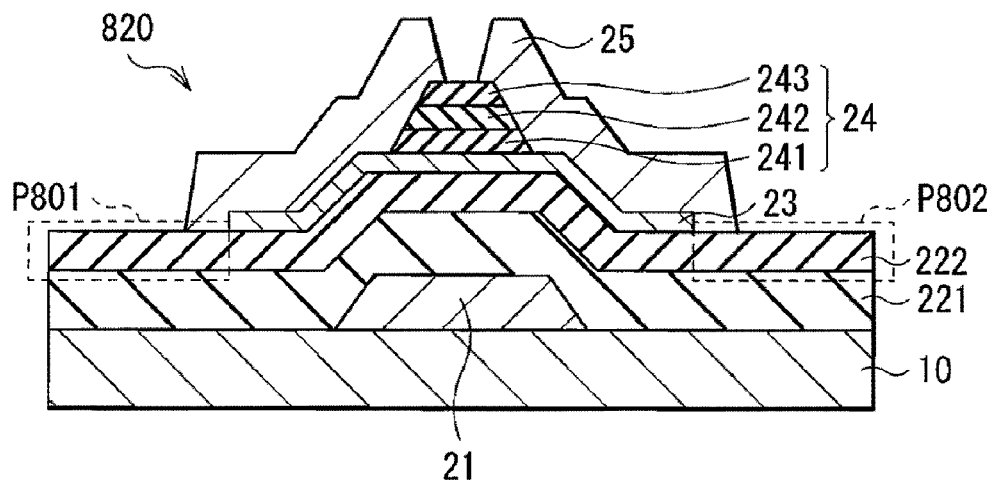
FIG. 11 is a cross-sectional view illustrating a configuration of TFT according to a Comparative Example.

In a TFT 820 according to the Comparative Example having a cross-sectional configuration illustrated in FIG. 11, a gate insulating film 222 including a silicon oxide film or a silicon oxynitride film is formed to contact with an oxide semiconductor layer 23. Also, an upper surface and a side surface of the oxide semiconductor layer 23 are covered, on the gate insulating film 222, by a source/drain electrode 25 and a channel protecting film 24. Thereby, oxygen in the oxide semiconductor layer 23 may be maintained in a stable state, and a favorable device-interface having low interface-state density may be formed between the gate insulating film 222 and the oxide semiconductor layer 23. However, unlike the TFT 20 according to the present embodiment, the gate insulating film 222 remains entirely on a substrate 10 even after the oxide semiconductor layer 23 is processed into the island-like configuration (note particularly the regions denoted by reference numerals P801 and P802 respectively in the drawing). Therefore, in the TFT 820 according to the Comparative Example, moisture or the like is supplied, due to diffusion, into the oxide semiconductor layer 23 through the gate insulating film 222 (i.e., the silicon oxide film or the silicon oxynitride film), which remains entirely on the substrate 10, and electrical characteristics of the TFT 820 according to the Comparative Example becomes unstable.

Present Embodiment

In contrast, according to the present embodiment, the gate insulating film 222 including the silicon oxide film or the silicon oxynitride film is selectively formed to contact with the oxide semiconductor layer 23 in the region corresponding to the oxide semiconductor layer 23. Thus, oxygen in the oxide semiconductor layer 23 is maintained in a stable state, and the favorable device-interface having low interface-state density is formed between the gate insulating film 222 and the oxide semiconductor layer 23. Also, the upper surface and the side surface of the oxide semiconductor layer 23 and the side surface of the gate insulating film 222 are covered, on the gate insulating film 221 including the silicon nitride film, by the source/drain electrode 25 and the channel protecting film 24. Thus, unlike the Comparative Example, the oxide semiconductor layer 23 has a configuration in which the oxide semiconductor layer 23 is shielded against external air. Hence, the entry of the moisture or the like into the oxide semiconductor layer 23 is suppressed.

Accordingly, in the present embodiment, the gate insulating film 222 including the silicon oxide film or the silicon oxynitride film is selectively formed to contact with the oxide semiconductor layer 23 in the region corresponding to the oxide semiconductor layer 23. Thus, the favorable device-interface is formed between the gate insulating film 222 and the oxide semiconductor layer 23. Hence, it is possible to suppress the formation of the lattice defect in the oxide semiconductor layer 23. Also, the upper surface and the side surface of the oxide semiconductor layer 23 and the side surface of the gate insulating film 222 are covered by the source/drain electrode 25 and the channel protecting film 24 on the gate insulating film 221 including the silicon nitride film. Thus, the entry of the moisture or the like into the oxide semiconductor layer 23 is suppressed. Hence, it is possible to suppress the adsorption of the moisture in the oxide semiconductor layer 23. Therefore, it is possible to improve the reliability in the thin-film transistor in which the oxide semiconductor layer is included.

Also, it is possible to realize a flat panel display which is inexpensive and high in quality by employing the display device utilizing the TFT 20 described above.

[2. Modification]

Hereinafter, Modifications of the embodiment of the invention will be described with reference to FIGS. 12 to 14. Note that the same or equivalent elements as those of the embodiment described above are denoted with the same reference numerals, and will not be described in detail.

[Modification 1]

Figure 12:
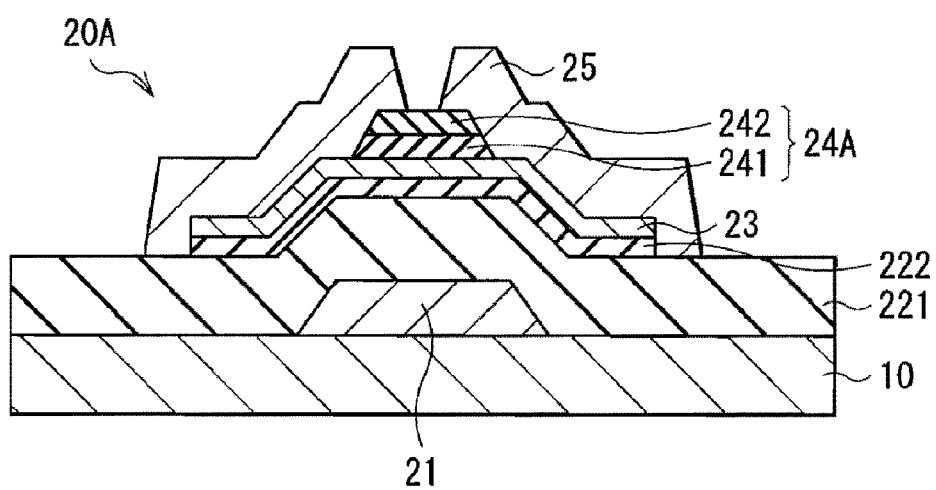
FIG. 12 is a cross-sectional view illustrating a configuration of TFT according to Modification 1 of the embodiment of the invention.

FIG. 12 illustrates a cross-sectional configuration of a TFT 20A according to Modification 1 of the embodiment of the invention. In the TFT 20A of the Modification 1, a channel protecting film 24A has a two-layer structure including a channel protecting film 241 and a channel protecting film 242 for simplification of the processes. The channel protecting film 241 can be an aluminum oxide film, and the channel protecting film 242 can be a silicon nitride film.

[Modification 2]

Figure 13:
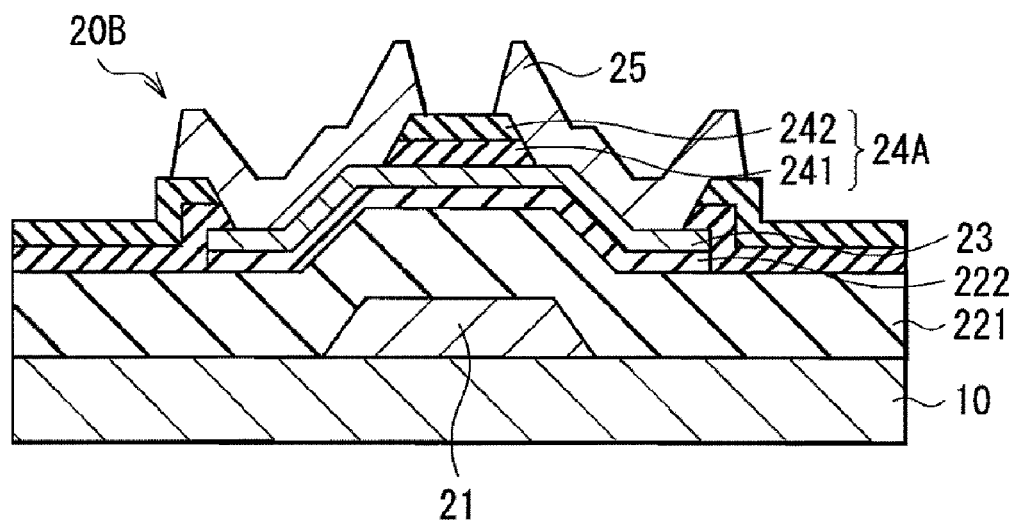
FIG. 13 is a cross-sectional view illustrating a configuration of TFT according to Modification 2 of the embodiment of the invention.

FIG. 13 illustrates a cross-sectional configuration of a TFT 20B according to Modification 2 of the embodiment of the invention. In the TFT 20B of the Modification 2, an opening is provided on a channel protecting film 24A only at a part which is in contact with a source/drain electrode 25. Also, the TFT 20B has a configuration in which the channel protecting film 24A and the source/drain electrode 25 remain on an entire surface of a substrate 10, and thus has a configuration which prevents the TFT 20B from the external moisture and so forth. Therefore, the embodiment of the invention is also applicable to such a TFT 20B having the configuration described before.

[Modification 3]

Figure 14:
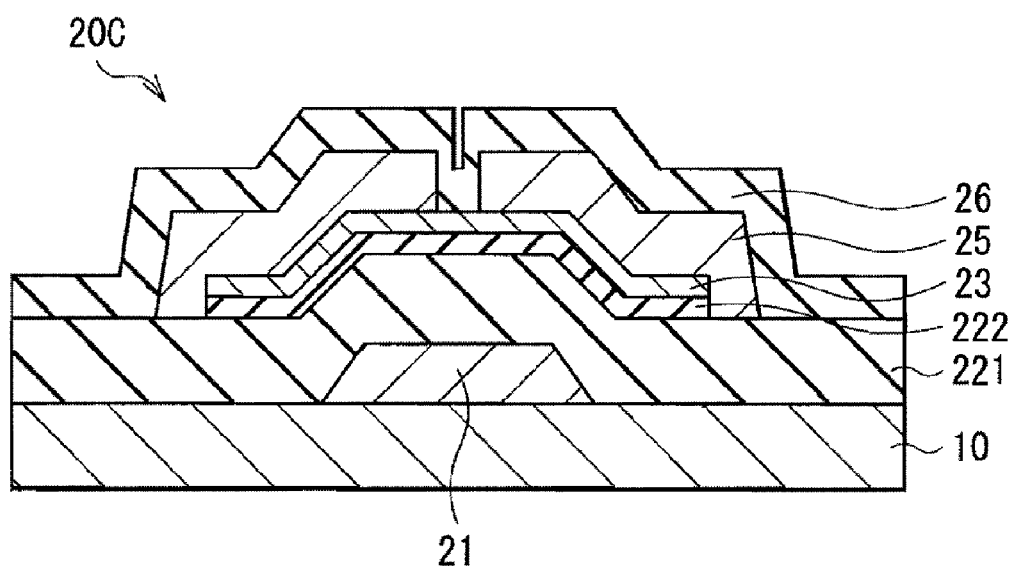
FIG. 14 is a cross-sectional view illustrating a configuration of TFT according to Modification 3 of the embodiment of the invention.

FIG. 14 illustrates a cross-sectional configuration of a TFT 20C according to Modification 3 of the embodiment of the invention. In the TFT 20C of the Modification 3, a protective film 26 or a "passivation film" 26 is provided instead of the channel protecting film 24 described in the foregoing, so as to cover an entire outermost surface of the TFT 20C. It is preferable that such a protective film 26 also include aluminum oxide or silicon nitride as in the channel protecting film 24. Alternatively, the protective film 26 may be a stacked film including at least one layer of an aluminum oxide film or a silicon nitride film.

[3. Module and Application Examples]

Hereinafter, Application Examples of the display device according to the above embodiment and the Modifications will be described with reference to FIGS. 15 to 20G The display device according to the embodiment and the Modifications is applicable to any electronic device, which can be a television apparatus, a digital camera, a computer including a personal laptop computer, a portable information terminal device including a cellular phone, a video camera, or any other suitable device utilizing a display. In other words, the display device according to any one of the embodiment and the Modifications is applicable to a display device of an electronic device in every field for displaying a video signal inputted from the outside or a video signal generated internally as an image or a video image.

[Module]

Figure 15:
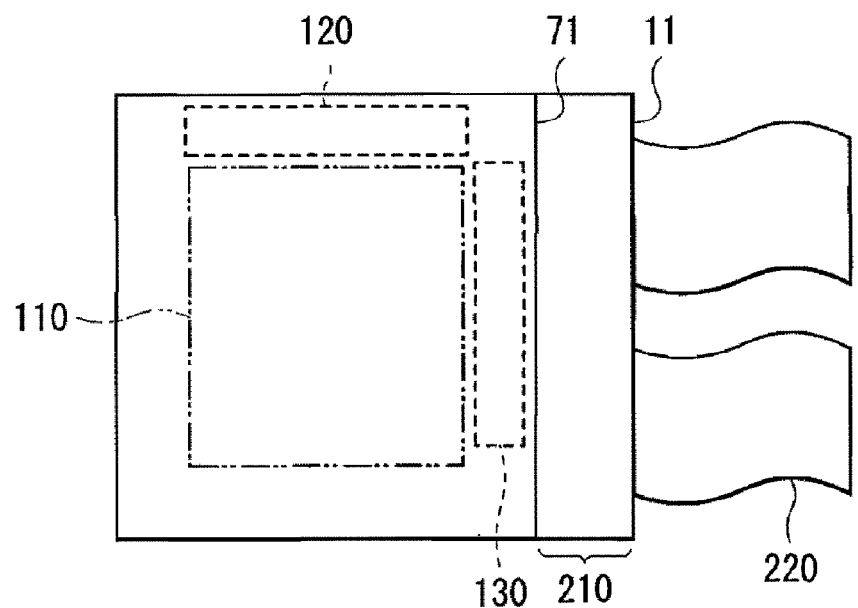
FIG. 15 is a plan view illustrating a schematic configuration of a module including the display device according to the embodiment of the invention.

The display device described with reference to the embodiment and the Modifications may be incorporated into various electronic devices, such as the electronic devices according to Application Examples 1 to 5 which will be described later, as a module illustrated in FIG. 15 for example. The module is provided with a region 210 disposed on one side of a substrate 11 and exposed from the sealing substrate 71 and the adhesion layer 60, and an external connection terminal (not illustrated) disposed in the exposed region 210 by extending lines of a signal line driving circuit 120 as the horizontal selector (HSEL) 121 and lines of a driving circuit 130 as the write scanner (WSCN) 131 and the power scanner (DSCN) 132, for example. The external connection terminal may be provided with a flexible printed circuit (FPC) 220 for inputting and outputting signals.

Application Example 1

Figure 16:
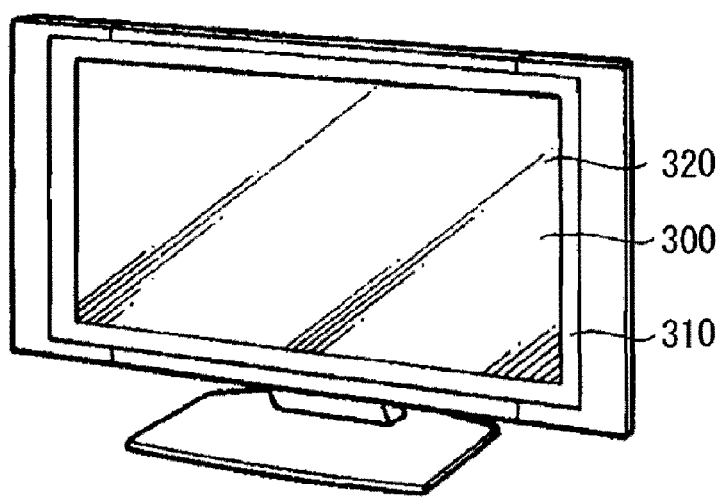
FIG. 16 is a perspective view illustrating an outside appearance of Application Example 1 of the display device according to the embodiment of the invention.

FIG. 16 illustrates an external appearance of a television apparatus to which the display device according to any one of the embodiment and the Modifications is applied. The television apparatus is provided with, for example, a video display screen unit 300 including a front panel 310 and a filter glass 320. The video display screen unit 300 includes the display device according to any one of the embodiment and the Modifications.

Application Example 2

Figure 17A:
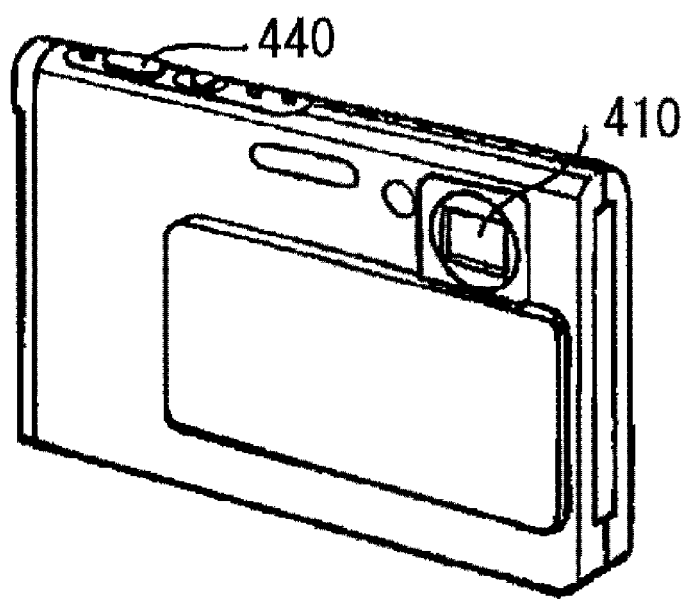
Figure 17B:
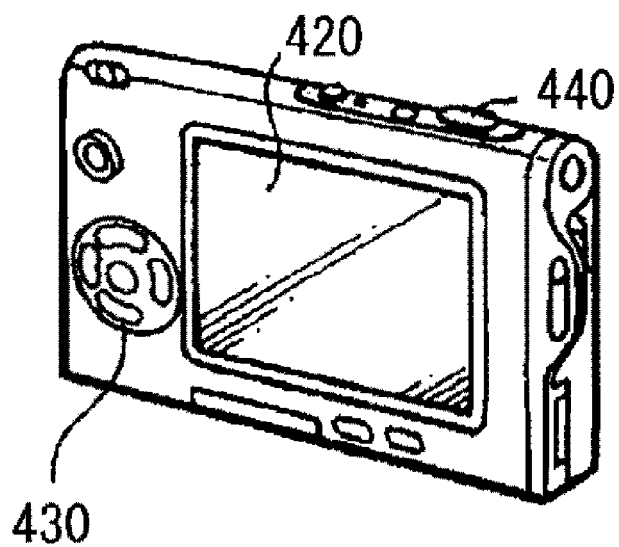

FIGS. 17A and 17B illustrate respectively an external appearance of a digital camera to which the display device according to any one of the embodiment and the Modifications is applied. The digital camera is provided with, for example, a light emitting unit 410 for flashlight, a display unit 420, a menu switch 430, and a shutter release button 440. The display unit 420 includes the display device according to any one of the embodiment and the Modifications.

Application Example 3

Figure 18:
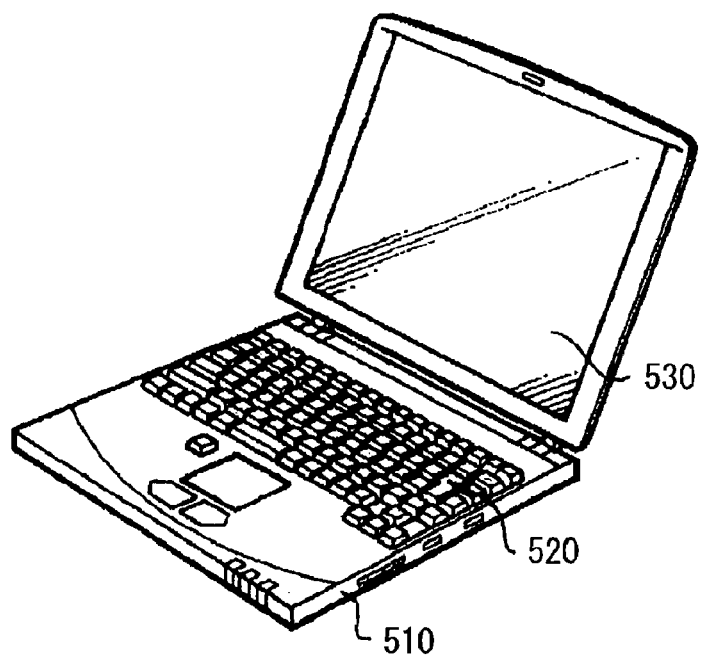
FIG. 18 is a perspective view illustrating an outside appearance of Application Example 3 of the display device according to the embodiment of the invention.

FIG. 18 illustrates an external appearance of a notebook or a "laptop" personal computer to which the display device according to any one of the embodiment and the Modifications is applied. The laptop personal computer is provided with, for example, a body 510, a keyboard 520 for manipulation such as inputting characters and the like, and a display unit 530 for displaying an image. The display unit 530 includes the display device according to any one of the embodiment and the Modifications.

Application Example 4

Figure 19:
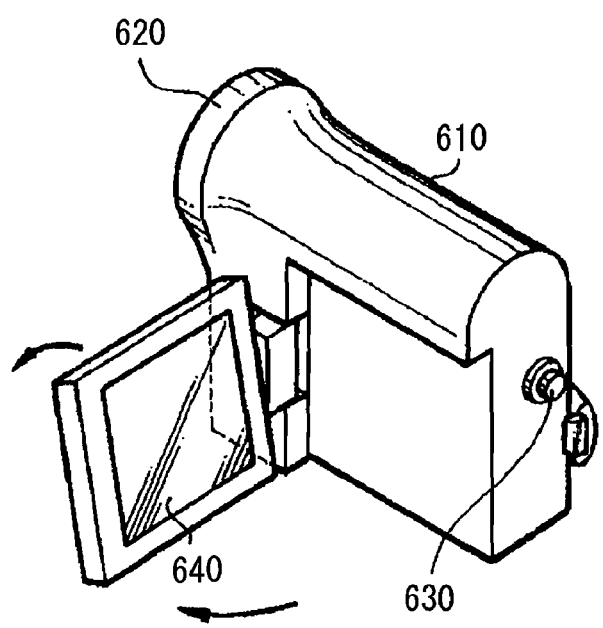
FIG. 19 is a perspective view illustrating an outside appearance of Application Example 4 of the display device according to the embodiment of the invention.

FIG. 19 illustrates an external appearance of a video camera to which the display device according to any one of the embodiment and the Modifications is applied. The video camera is provided with, for example, a body 610, a lens 620 provided in a front face of the body 610 for capturing an image of a photographic object, a shooting start/stop switch 630, and a display unit 640. The display unit 640 includes the display device according to any one of the embodiment and the Modifications.

Application Example 5

FIGS. 20A to 20G illustrate respectively an external appearance of a cellular phone to which the display device according to any one of the embodiment and the Modifications is applied. The cellular phone is provided with, for example, an upper casing 710 and a lower casing 720 connected through a coupling part (or a "hinge") 730, a display 740, a sub-display 750, a picture light 760, and a camera 770. The display 740 or the sub-display 750 includes the display device according to any one of the embodiment and the Modifications.

Although the present invention has been described in the foregoing by way of example with reference to the embodiment, the Modifications, and the Application Examples, the present invention is not limited thereto but may be variously modified.

For example, both of the channel protecting film 24 described in the embodiment and the protective film (i.e., the passivation film) 26 described in the Modification 3 may be formed in a thin-film transistor. Such a structure makes it possible to protect the thin-film transistor from the external moisture or the like more strictly, and to further improve the reliability in the thin-film transistor.

Also, the invention is not limited to the material and the thickness of each of the layers, the method and the conditions for the film-formation, and so forth described in the above embodiment, the Modifications, and the Application Examples. Other material, other thickness, other method, other conditions, and so on may be employed.

Moreover, although the configuration of the organic light-emitting elements 10R, 10G, and 10B has been specifically described in the embodiment, the Modifications, and the Application Examples, not all of the layers described above have to be provided. Alternatively, one or more other layer or layers may be further provided.

In addition, the present invention is applicable to display devices utilizing other types of display elements. The display element, other than the organic light-emitting element, can be a liquid crystal display element, an inorganic electroluminescent element, an electrodeposition display element, an electrochromic display element, and so forth.

The present application contains subject matter related to that disclosed in Japanese Priority Patent Application JP 2009-024034 filed in the Japan Patent Office on Feb. 4, 2009, the entire content of which is hereby incorporated by reference.

Although the present invention has been described in terms of exemplary embodiments, it is not limited thereto. It should be appreciated that variations may be made in the described embodiments by persons skilled in the art without departing from the scope of the present invention as defined by the following claims. The limitations in the claims are to be interpreted broadly based on the language employed in the claims and not limited to examples described in the present specification or during the prosecution of the application, and the examples are to be construed as non-exclusive. For example, in the present disclosure, the term "preferably", "preferred" or the like is non-exclusive and means "preferably", but not limited to. The use of the terms first, second, etc. do not denote any order or importance, but rather the terms first, second, etc. are used to distinguish one element from another. Moreover, no element or component in the present disclosure is intended to be dedicated to the public regardless of whether the element or component is explicitly recited in the following claims.

What is claimed is:

1. A thin-film transistor, comprising:
a gate electrode formed on a substrate;
an oxide semiconductor layer forming a channel region corresponding to the gate electrode;
a first gate insulating film formed on the substrate and the gate electrode, and including a silicon nitride film;
a second gate insulating film selectively formed to contact with the oxide semiconductor layer in a region, on the first gate insulating film, corresponding to the oxide semiconductor layer, and including one of a silicon oxide film and a silicon oxynitride film;
a source/drain electrode; and
a protecting film,
wherein an upper surface and a side surface of the oxide semiconductor layer and a side surface of the second gate insulating film are covered, on the first gate insulating film, by the source/drain electrode and the protecting film.

2. The thin-film transistor according to claim 1, wherein the protecting film includes one of aluminum oxide and silicon nitride.

3. The thin-film transistor according to claim 2, wherein the protecting film includes a stacked film having at least one layer of one of an aluminum oxide film and a silicon nitride film.

4. The thin-film transistor according to claim 1, wherein the protecting film includes a channel protecting film provided at least in a region corresponding to the channel region.

5. The thin-film transistor according to claim 1, wherein the protecting film includes a passivation film formed to cover an entire outermost surface of the thin-film transistor.

6. The thin-film transistor according to claim 1, wherein
the source/drain electrode includes a stacked configuration having a plurality of metal layers, and
a metal layer, which is in contact with the oxide semiconductor layer, of the plurality of metal layers includes a metal material containing oxygen.

7. The thin-film transistor according to claim 1, wherein
the source/drain electrode includes a stacked configuration having a plurality of metal layers, and
a metal layer, which is in contact with the oxide semiconductor layer, of the plurality of metal layers includes molybdenum.

8. A display device, comprising
a display element, and
a thin-film transistor driving the display element, the thin-film transistor including:
a gate electrode formed on a substrate;
an oxide semiconductor layer forming a channel region corresponding to the gate electrode;
a first gate insulating film formed on the substrate and the gate electrode, and having a silicon nitride film;
a second gate insulating film selectively formed to contact with the oxide semiconductor layer in a region, on the first gate insulating film, corresponding to the oxide semiconductor layer, and having one of a silicon oxide film and a silicon oxynitride film;
a source/drain electrode; and
a protecting film,
wherein an upper surface and a side surface of the oxide semiconductor layer and a side surface of the second gate insulating film are covered, on the first gate insulating film, by the source/drain electrode and the protecting film.

9. The display device according to claim 8, wherein the display element includes an organic light-emitting element having an anode, an organic layer including a light-emitting layer, and a cathode.

* * * * *